United States Patent [19]

Sugawara et al.

[11] 4,203,799
[45] May 20, 1980

[54] METHOD FOR MONITORING THICKNESS OF EPITAXIAL GROWTH LAYER ON SUBSTRATE

[75] Inventors: Katsuro Sugawara, Kodaira; Yukiyoshi Nakazawa, Ohme; Katsuhiko Itoh, Kokubunji, all of Japan

[73] Assignee: Hitachi, Ltd., Japan

[21] Appl. No.: 902,033

[22] Filed: May 2, 1978

Related U.S. Application Data

[63] Continuation of Ser. No. 690,304, May 26, 1976, abandoned.

[30] Foreign Application Priority Data

May 30, 1975 [JP] Japan ................................. 50/64317

[51] Int. Cl.² ...................... B01J 17/30; B01J 17/32; B01J 17/40; G01B 19/38
[52] U.S. Cl. .................................... 156/601; 148/175; 156/612; 156/613; 156/614; 156/DIG. 64; 356/357; 356/358; 427/10
[58] Field of Search ............... 156/601, 610, 612–614, 156/DIG. 64; 427/10, 252; 148/175; 356/357, 358

[56] References Cited

U.S. PATENT DOCUMENTS

| | | | |
|---|---|---|---|
| 3,099,579 | 7/1963 | Spitzer et al. | 156/601 |
| 3,620,814 | 11/1971 | Clark et al. | 427/10 |
| 3,984,263 | 10/1978 | Asao et al. | 156/610 |

OTHER PUBLICATIONS

"Interference . . . "; Soviet Physics–Semi-Conductors; vol. 5; No. 5; 11–1971.
"In-Process . . . "; J. Electrochem. Soc.; vol. 119, No. 1; 1971.
"Measurement . . . "; Review of Scientific Instruments; vol. 38; No. 8; 1967.
"Nondestructive . . . "; J. Electrochem. Soc.; vol. 119; No. 1; 1972.

Primary Examiner—Barry S. Richman
Assistant Examiner—Bradley Garris
Attorney, Agent, or Firm—Craig and Antonelli

[57] ABSTRACT

In growing on a substrate a film of substance of a similar kind to the substrate, ions are implanted into the substrate to form within the substrate a layer of substance having an optical property different from that of the substrate, and an epitaxial film is then grown. Thus, the thickness of the film can be monitored with an interference waveform appearing with its growth.

10 Claims, 3 Drawing Figures

METHOD FOR MONITORING THICKNESS OF EPITAXIAL GROWTH LAYER ON SUBSTRATE

This is a continuation of application Ser. No. 690,304, filed May 26, 1976, now abandoned.

BACKGROUND OF THE INVENTION

1. Field of the Invention

The present invention relates to a controlling method adapted for use in a homoepitaxial treatment for a monocrystalline film of silicon or the like on a silicon substrate (Si/Si), wherein the monocrystalline film of silicon is controlled in thickness at the time of its growth.

2. Description of the Prior Art

A substrate of structure in which an epitaxial growth layer (Ep-layer) is formed on a substrate of sapphire or silicon by a vapor growth is used as a substrate for forming semiconductor element therein from the viewpoint of improving their property. In this case, the Ep-layer is required to have a uniform thickness, for example, 1.6 μm±0.1 μm in the Ep-layer for a bipolar memory.

In this respect, the Ep-layer must be monitored in thickness. In a heteroepitaxial treatment such as an Ep-layer of silicon on sapphire, the thickness of the Ep-layer has conventionally been monitored at the time of its growth.

In order to apply such a method to practice in a homoepitaxial treatment such as an Ep-layer of silicon on silicon (Si/Si), it is necessary to employ a dummy substrate made of sapphire, polycrystalline silicon or the like which differs in property from a silicon substrate, considering that the substrate has the same optical property (refractive index, absorption coefficient) as the Ep-layer. The Ep-layer on the silicon substrate, however, has a speed of growth different from that of the Ep-layer on the dummy substrate (sapphire or polycrystalline silicon). Further, particularly in the case of a sapphire substrate, impurities contained in sapphire are apt to out-diffuse in an ambient atmosphere whereby contamination of the epitaxial layer occurs.

SUMMARY OF THE INVENTION

It is therefore, an object of the present invention to provide a method for controlling the thickness of the Ep-layer in the homoepitaxial treatment with excellent precision.

The present invention is characterized in that a substrate on which the Ep-layer is to be formed is formed on its surface with a layer of substance having different optical properties from those of the substrate, and the Ep-layer is then grown, the thickness of which is monitored with an interference waveform appearing with its growth.

DESCRIPTION OF THE PREFERRED EMBODIMENTS

The present invention will be described with reference to its general arrangement prior to the description of its embodiment.

Figure 1:
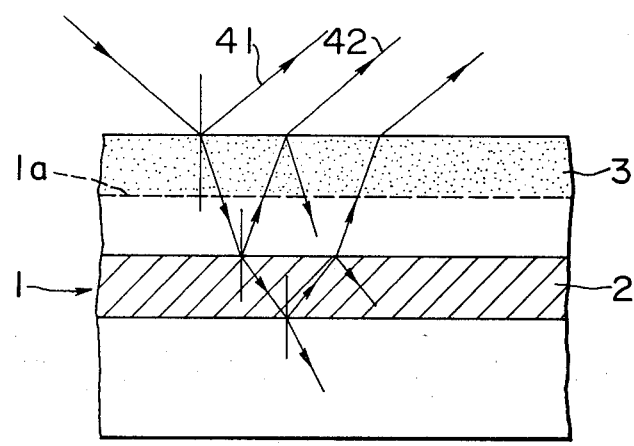
FIG. 1 is a schematic cross-section for explaining the arrangement of the present invention.

An ion implantation technique is used as the means for forming a layer of substance having a different optical property. A layer 2 of an insulating material, such as $Si_3N_4$, $SiO_2$ or the like, produced when, for example, ions of nitrogen or oxygen are implanted into a substrate 1 of silicon, is formed under a surface 1a of the silicon substrate 1 by the ion implantation technique (See FIG. 1). Even after the ion implantation as well as before, the surface 1a of the substrate is kept exposed. This leads to the growth of a uniform monocrystalline layer 3 of silicon (Ep-layer) thereon. In other words, such an arrangement makes it possible to grow the monocrystalline silicon 3 while maintaining the difference of optical properties at the interface between the silicon substrate 1 and the Ep-layer 3. The layer 2 of substance having the optical property different from that of the Ep-layer 3 is, on the other hand, formed under the surface of the silicon substrate 1. This allows an interference wave to be produced by light 41 reflected from the surface of the Ep-layer 3 and light 42 reflected at the surface of the layer 2 of the substance. It is to be noted that a dummy substrate on which the layer 2 of substance such as $Si_3N_4$, $SiO_2$ is formed may be provided either seperately from the substrate of silicon or on a portion of the same substrate.

Figure 2:
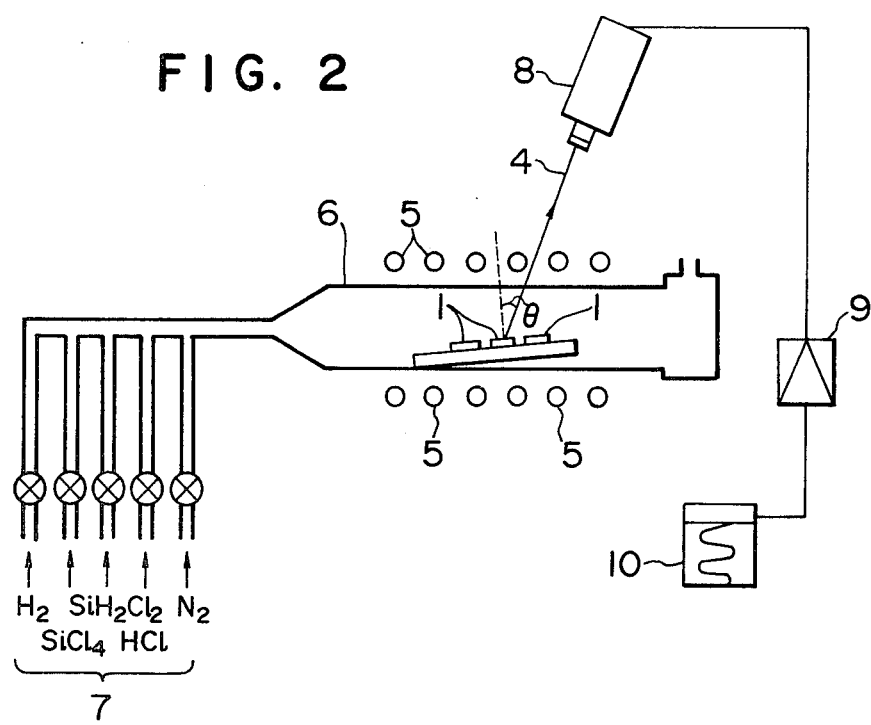
FIG. 2 is a diagram showing a system adapted for use in Si/Si.

FIG. 2 shows an embodiment in which a method of the present invention is actually applied to Si/Si. As shown in the figure, the substrate 1 of silicon on which the Ep-layer 3 is to be formed is disposed within a reactor tube 6 of quartz provided with a heater 5 on its outer circumference. The atmosphere around the substrate 1 is set to a high temperature of about 1150° C. by the heater 5. In this state, a reaction gas 7 produced by a $SiCl_4$—$H_2$ gas system is supplied from one end of the reactor tube 6 with the other end thereof connected to an exhaust system. In such conditions, the Ep-layer 3 is successively grown on the silicon substrate 1. In this example, ions of nitrogen were implanted into the silicon substrate 1, for example, with an implantation energy of 80 KeV prior to the growth of the Ep-layer and subsequently the silicon substrate is subjected to heat treatment for about 30 minutes at 1200° C. in $N_2$ atmosphere in order to form the layer 2 of $Si_3N_4$ as thick as 0.2 μm at a position 0.2 μm deep from the surface 1a of the substrate. At the time of growth of the Ep-layer 3, infrared radiation 4 from the substrate 1 is received by a detector 8 of PbS provided outside of the reaction tube 6, amplified by an amplifier 9 and then recorded in the form of an interference wave by a recorder 10.

Figure 3:
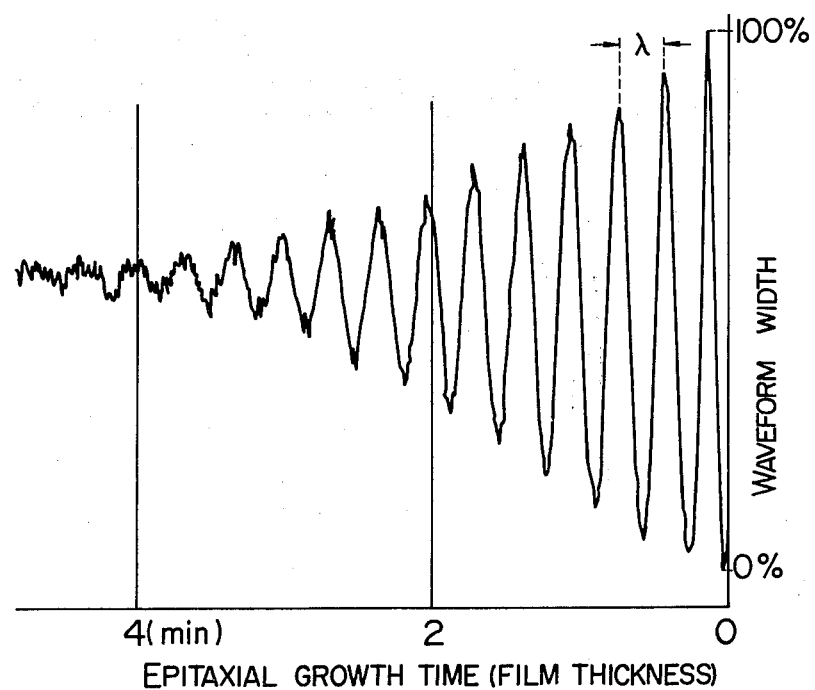
FIG. 3 is a waveform showing one example of an interference waveform in the Si/Si.

FIG. 3 shows one example of the interference wave. The abscissa shows an epitaxial growth time (or thickness). The calculation of the thickness d of the actual Ep-layer 3 from such an interference waveform is performed by the use of the following equation:

$$d = m\lambda/2n^2 \cos\theta$$

where n shows a refractive index of silicon (equal to 3.42), θ an angle of the detector 8 relative to the substrate 1 (60 degrees, for example), λ a wavelength, and m the number of waveform (0, 1, 2, ...).

It has been found that the thickness d can be controlled with precision of the order of ±0.05 μm when a filter of 2 μm, which is used to improve detection precision, is provided on an incident window of the detector 8.

It is to be noted that light for producing the interference waveform can be emitted by using external light of a laser other than the infrared light 4 of radiation emitted from the substrate 1 itself.

Further, the present invention is applicable to a thickness control in a homoepitaxial not only in the Si/Si but in a III-V group semiconductors (intermetallic compounds) or II-VI group or in an example in which the formed Ep-layer is vapor-etched. Further, the present invention makes it possible to control not only the thickness of film with precision but the composition of film, for example, by controlling a source flow so that a speed of formation of the film may be kept constant and keeping a flow ratio of dopant to source constant. Further, in the present invention, the variation of an impurity concentration or film composition with regard to the thickness of film allows the control of the distribution of impurity in a direction of thickness in the Ep-layer.

We claim:

1. A method for monitoring thickness of a homoepitaxial growth layer, comprising the steps of:
   (a) implanting ions into an original substrate to a predetermined depth from a major surface so as to form within the substrate below said major surface a layer of substance having an optical property different from that of the substance of the original substrate;
   (b) growing on said major surface of the original substrate a homoepitaxial layer having substantially the same optical properties as the original substrate;
   (c) receiving light from the original substrate and from the surface of the implanted layer at the time of growth of the epitaxial layer in the form of an interference waveform; and
   (d) monitoring thickness of an epitaxial growth layer by the use of the interference waveform.

2. A method for monitoring thickness of a homoepitaxial growth layer according to claim 1, wherein the thickness of the homoepitaxial growth layer is monitored with the interference waveform in accordance with $$d = m\lambda/2n^2 \cos\theta$$

where d shows the thickness of the layer, n a refractive index of the original substrate, $\theta$ an angle of the received light relative to the original substrate, $\lambda$ a wavelength of the received light, and m the number of the waveform.

3. A method for monitoring thickness of a homoepitaxial growth layer according to claim 1, wherein the light from the orginal substrate is light of radiation emitted from the original substrate itself.

4. A method for monitoring thickness of a homoepitaxial growth layer according to claim 1, wherein the light from the original substrate is produced by irradiation of the original substrate with an external laser beam.

5. A method for monitoring thickness of a homoepitaxial growth layer according to claim 1, wherein the interference waveform is amplified by an amplifier after reception of the light from the original substrate and is thereafter recorded in a recorder.

6. A method for monitoring thickness of a homoepitaxial growth layer according to claim 1, wherein the original substrate is made of silicon, the implanted ions are selected from the group consisting of ions of nitrogen and oxygen, the layer of substance having the optical property different from that of the substance of the original substrate is one selected from the group consisting of $Si_3N_4$ and $SiO_2$, and the homoepitaxial growth layer is an epitaxial layer of silicon formed by introducing a gas containing $SiCl_4$ and $H_2$.

7. A method for monitoring thickness of a homoepitaxial growth layer according to claim 6, wherein implantation energy is 80 KeV and a layer of $Si_3N_4$ is formed to be as thick as 0.2 μm at a position 0.2 μm deep under the major surface of the original silicon substrate.

8. A method for monitoring thickness of a homoepitaxial growth layer according to claim 6, wherein the original silicon substrate is heated to a temperature of 1150° C. at the time of the homoepitaxial growth.

9. A method for growing a homoepitaxial layer on a monocrystalline semiconductor substrate comprising the steps of:
   preparing a dummy substrate including a thin monocrystalline semiconductor surface layer and having an insulating material region underlying said thin surface layer;
   arranging in a reactor said dummy substrate together with a monocrystalline semiconductor substrate of the same kind of substance as that of said thin surface layer;
   growing epitaxial layers of the same kind of substance, and of the same optical properties, as said thin surface layer simultaneously on said surface layer of the dummy substrate and on said semiconductor substrate; and
   during said step of growing the epitaxial layers, monitoring the thickness of the epitaxial layer on said dummy substrate by the use of light received from the surface of said thin surface layer and from the surface of said insulating material region in the form of an interference waveform and controlling the reaction of epitaxial growth based on the obtained thickness information.

10. A method for growing a homoepitaxial layer on a monocrystalline substrate comprising the steps of:
   preparing a substrate of monocrystalline semiconductor material having a fractional portion which includes an insulating region underlying a thin surface layer of said monocrystalline semiconductor material, the remaining portion of said substrate consisting of said monocrystalline semiconductor material,
   growing an epitaxial layer of the same kind of substance, and of the same optical properties, as said monocrystalline semiconductor material on the surface of both portions of the substrate; and
   during said step of growing the epitaxial layer, monitoring the thickness of the epitaxial layer at said fractional portion by the use of light received from the surface of said fractional portion and from the surface of said insulating region in the form of an interference waveform and controlling the reaction of epitaxial growth based on the obtained thickness information.

* * * * *